(12) United States Patent
Chuang et al.

(10) Patent No.: US 10,411,055 B2
(45) Date of Patent: Sep. 10, 2019

(54) SENSOR PACKAGE STRUCTURE

(71) Applicant: KINGPAK TECHNOLOGY INC., Hsin-Chu County (TW)

(72) Inventors: Chun-Hua Chuang, Hsin-Chu County (TW); Wen-Chung Huang, Hsin-Chu County (TW); Chung-Hsien Hsin, Hsin-Chu County (TW); Chen-Pin Peng, Hsin-Chu County (TW); Li-Chun Hung, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 15/907,360

(22) Filed: Feb. 28, 2018

(65) Prior Publication Data

US 2019/0074310 A1    Mar. 7, 2019

Related U.S. Application Data

(60) Provisional application No. 62/553,153, filed on Sep. 1, 2017.

(30) Foreign Application Priority Data

Nov. 10, 2017    (CN) .......................... 2017 1 1104373

(51) Int. Cl.
*H01L 27/146* (2006.01)
*H01L 23/053* (2006.01)
(Continued)

(52) U.S. Cl.
CPC ...... *H01L 27/14618* (2013.01); *H01L 23/053* (2013.01); *H01L 23/10* (2013.01);
(Continued)

(58) Field of Classification Search
None
See application file for complete search history.

(56) References Cited

U.S. PATENT DOCUMENTS 4,894,707 A * 1/1990 Yamawaki .......... H01L 31/0203
257/667
5,337,217 A * 8/1994 Tarn ........................ H01L 25/16
174/551
(Continued)

FOREIGN PATENT DOCUMENTS

JP    2010141123 A    6/2010
JP    2014192442 A    10/2014

*Primary Examiner* — Erik Kielin
(74) *Attorney, Agent, or Firm* — Li & Cai Intellectual Property (USA) Office

(57) ABSTRACT

A sensor package structure includes a substrate, a sensor chip, a plurality of wires, a supporting frame, a transparent cover, and a molding compound. The substrate includes a chip bonding region and a plurality of first pads outside the chip bonding region. The sensor chip is disposed on the chip bonding region, and includes a sensing region and a plurality of second pads. Each wire has two opposite ends respectively connected to one of the first pads and one of the second pads. The supporting frame is arranged above the substrate and/or the sensor chip and includes a positioning portion. The transparent cover is fixed in position above the sensor chip by the positioning portion so as to maintain a vertical distance there-between. The molding compound fills the space in-between the substrate and the supporting frame and covers a part of an upper surface of the supporting frame.

11 Claims, 12 Drawing Sheets

(51) Int. Cl.
  *H01L 23/10* (2006.01)
  *H01L 23/13* (2006.01)
  *H01L 23/31* (2006.01)
  *H01L 23/498* (2006.01)
  *H01L 23/00* (2006.01)

(52) U.S. Cl.
  CPC .......... *H01L 23/13* (2013.01); *H01L 23/3121* (2013.01); *H01L 23/49811* (2013.01); *H01L 23/562* (2013.01); *H01L 24/06* (2013.01); *H01L 24/48* (2013.01); *H01L 27/14634* (2013.01); *H01L 27/14636* (2013.01); *H01L 2224/04042* (2013.01); *H01L 2224/06135* (2013.01); *H01L 2224/48106* (2013.01); *H01L 2224/48227* (2013.01)

(56) References Cited

U.S. PATENT DOCUMENTS

| | | | |
|---|---|---|---|
| 9,681,032 B1* | 6/2017 | Tam | H04N 5/2254 |
| 2005/0073036 A1* | 4/2005 | Appelt | H01L 23/4334 257/678 |
| 2008/0099866 A1* | 5/2008 | Chang | H01L 27/14618 257/433 |
| 2009/0045476 A1* | 2/2009 | Peng | H01L 27/14618 257/432 |
| 2010/0149410 A1 | 6/2010 | Matsuzawa | |
| 2011/0024610 A1* | 2/2011 | Tu | H01L 23/10 250/239 |
| 2011/0024862 A1* | 2/2011 | Tu | H01L 27/14618 257/434 |
| 2011/0156187 A1* | 6/2011 | Tu | H01L 27/14618 257/432 |
| 2011/0156188 A1 | 6/2011 | Tu et al. | |
| 2012/0126386 A1 | 5/2012 | Bolken et al. | |
| 2013/0149805 A1* | 6/2013 | Chuang | H01L 31/18 438/65 |
| 2016/0174844 A1* | 6/2016 | Hasegawa | A61B 1/042 433/27 |
| 2019/0006253 A1* | 1/2019 | Wang | H01L 23/24 |

* cited by examiner

SENSOR PACKAGE STRUCTURE

BACKGROUND OF THE INVENTION

1. Field of the Invention

The present disclosure relates to a package structure; in particular, to a sensor package structure.

2. Description of Related Art

Conventional sensor package structures adopt an "image sensor molded on leadless chip carrier (iMLCC)" configuration in order to reduce size. The iMLCC configuration is provided with a frame between a transparent cover and a sensor chip for maintaining a vertical distance between the transparent cover and the sensor chip. However, in view of maintaining the vertical distance between the transparent cover and the sensor chip, there is still room for improvement in the conventional sensor package structure.

SUMMARY OF THE INVENTION

The present disclosure provides a sensor package structure to solve the drawbacks associated with conventional sensor package structures.

The present disclosure discloses a sensor package structure, which includes a substrate, a sensor chip, a plurality of wires, a supporting frame, a transparent cover, and a molding compound. The substrate includes a chip bonding region and a plurality of first pads arranged outside the chip bonding region. The sensor chip is disposed on the chip bonding region and includes a sensing region and a plurality of second pads arranged outside the sensing region. Each of the wires has a first end and an opposite second end. The first ends of the wires are respectively connected to the first pads, and the second ends of the wires are respectively connected to the second pads. The supporting frame is arranged above the substrate and/or the sensor chip. The supporting frame includes a positioning portion formed at an inner periphery thereof. The transparent cover is disposed on the supporting frame. The transparent cover is fixed in position above the sensor chip by the positioning portion so as to maintain a vertical distance from the transparent cover to the sensor chip. The molding compound fills the space in-between the substrate and the supporting frame and covers a part of an upper surface of the supporting frame.

In summary, the vertical distance between the transparent cover and the sensor chip in the sensor package structure of the present disclosure can be effectively maintained by substantially embedding the supporting frame in the molding compound (e.g., the molding compound fills in-between the substrate and the supporting frame and covers a part of the upper surface of the supporting frame). Moreover, the positioning portion formed in the supporting frame is capable of fixing the transparent cover, thereby maintaining the relative position of the transparent cover and the sensor chip.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 14B, which illustrate embodiments of the present disclosure. References are hereunder made to the detailed descriptions and appended drawings in connection with the present disclosure. However, the appended drawings are merely provided for exemplary purposes, and should not be construed as restricting the scope of the present disclosure.

The present disclosure discloses a sensor package structure, which can be selectively sliced according to design requirements. That is to say, the sensor package structure of the present disclosure can be provided in a sliced state or in a non-sliced state. In order to clearly describe the present disclosure, each of the following embodiments first discloses the sensor package structure in the non-sliced state, and then discloses the different features of the sensor package structure in the sliced state.

First Embodiment

Figure 1:
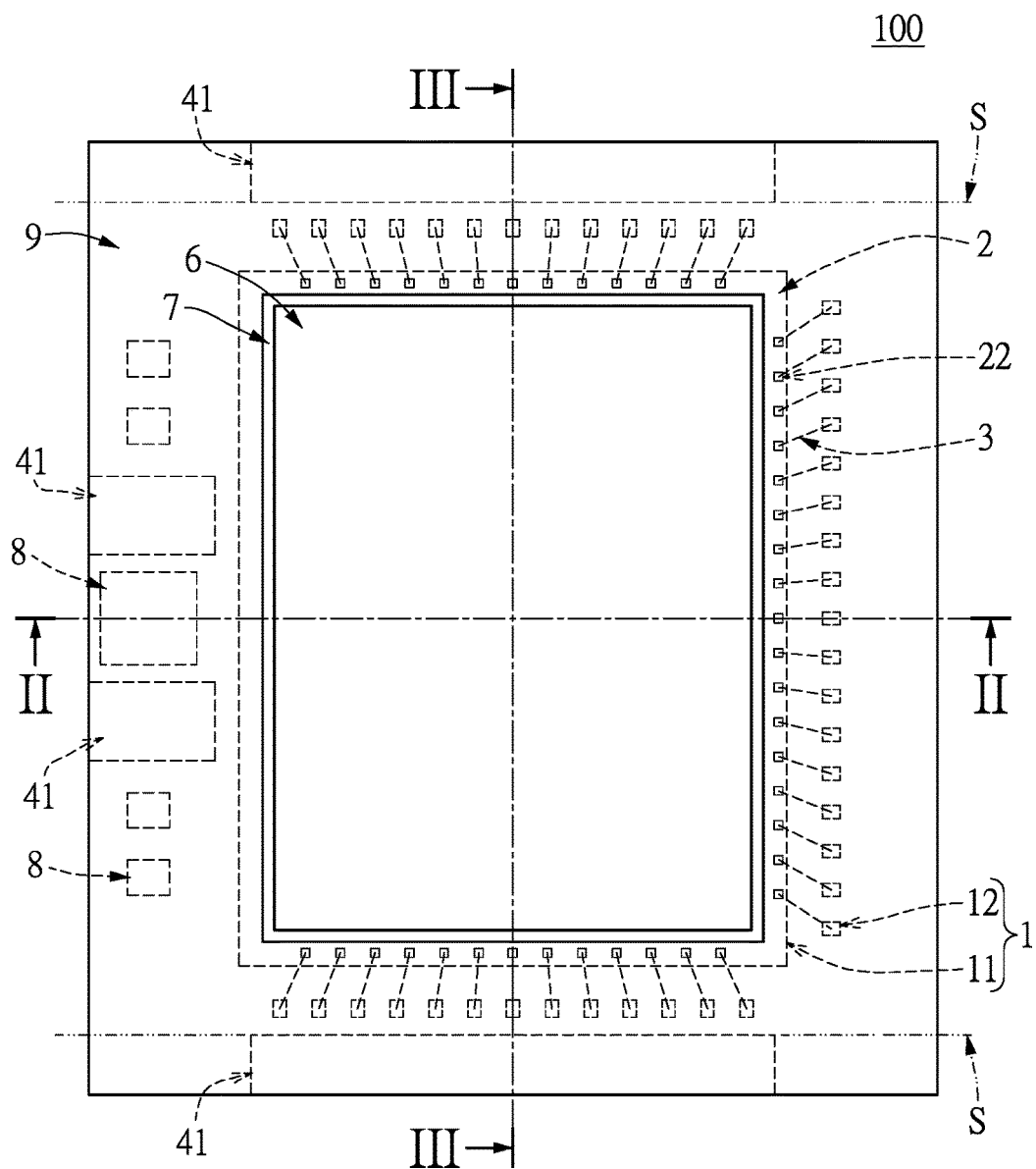
FIG. 1 is a top planar view showing a sensor package structure before cutting according to a first embodiment of the present disclosure.
Figure 2:
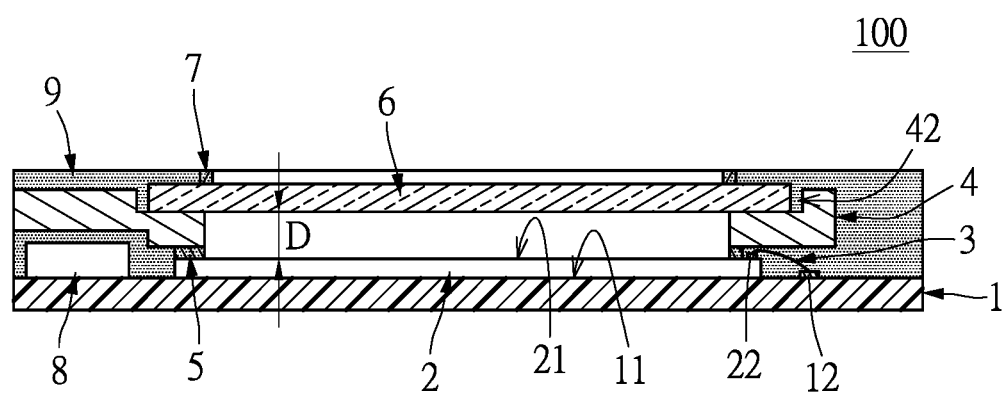
FIG. 2 is a cross-sectional view taken along a cross-sectional line II-II of FIG. 1.
Figure 3:
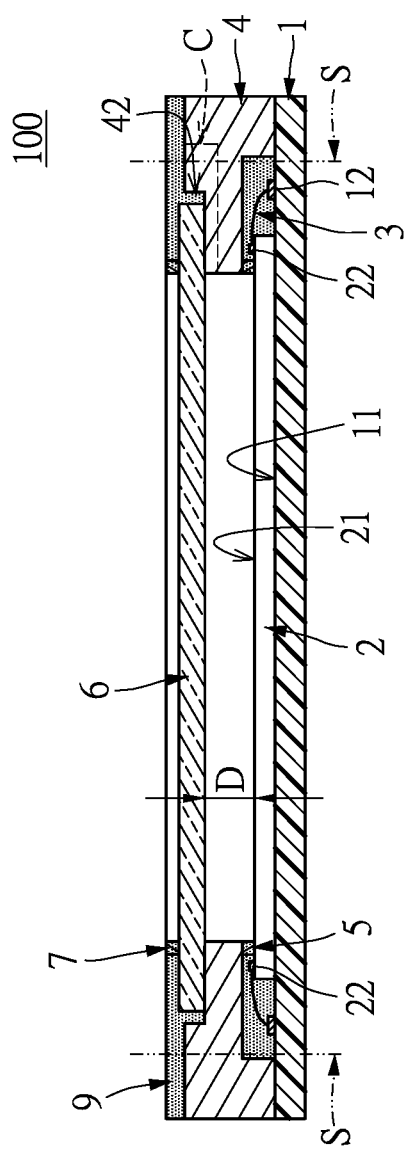
FIG. 3 is a cross-sectional view taken along a cross-sectional line III-III of FIG. 1.

Reference is made to FIGS. 1 to 5, which illustrate a first embodiment of the present disclosure. As shown in FIGS. 1 to 3, the sensor package structure 100 includes a substrate 1, a sensor chip 2 disposed on the substrate 1, a plurality of wires 3 electrically connected to the substrate 1 and the sensor chip 2, a supporting frame 4 arranged above the substrate 1 and/or the sensor chip 2, a sealant 5 adhering the supporting frame 4 to the sensor chip 2, a transparent cover 6 disposed on the supporting frame 4, a retaining wall 7 disposed on a top surface of the transparent cover 6, a molding compound 9 filling in-between the substrate 1 and the supporting frame 4 and covering a part of an upper surface of the supporting frame 4, and at least one electronic component 8 disposed on the substrate 1 and embedded in the molding compound 9. The following description discloses the structure and connection relationship of each component of the sensor package structure 100.

The substrate 1 in the present embodiment has a square shape or a rectangular shape, and at least one edge of the substrate 1 has a length less than or equal to 7.5 mm. Preferably, the length of each of the edges of the substrate 1 is less than or equal to 7.5 mm. The substrate 1 includes a chip bonding region 11 arranged on a top surface thereof and a plurality of first pads 12 arranged outside the chip bonding region 11. The chip bonding region 11 corresponds in shape to the sensor chip 2. The chip bonding region 11 in the present embodiment has a rectangular shape having two opposite short edges and two opposite long edges (as shown in FIG. 1), and the first pads 12 are respectively arranged outside the two short edges and one of the two long edges of the chip bonding region 11.

The sensor chip 2 in the present embodiment is an image sensor chip, and includes a sensing region 21 arranged on a top surface thereof and a plurality of second pads 22 arranged outside the sensing region 21. The sensing region 21 in the present embodiment has a rectangle shape having two opposite short edges and two opposite long edges (as shown in FIG. 1), and the second pads 22 are respectively arranged outside the two short edges and one of the two long edges of the sensing region 21.

Furthermore, the sensor chip 2 is disposed on the chip bonding region 11 of the substrate 1, and the second pads 22 respectively correspond in position to the first pads 12. In other words, outside one of the long edges of the chip bonding region 11 of the substrate 1, none of the first pads 12 are arranged. Outside one of the long edges of the sensing region 21 of the sensor chip 2, none of the second pads 22 are arranged. The long edge of the sensing region 21 of the sensor chip 2, which is provided without any of the second pads 22 arranged outside thereof, is adjacent to the long edge of the chip bonding region 11 of the substrate 1, which is provided without any of the first pads 12 arranged outside thereof.

Each of the wires 3 has a first end and an opposite second end, the first ends of the wires 3 being respectively connected to the first pads 12, and the second ends of the wires 3 being respectively connected to the second pads 22, thereby establishing an electrical connection between the substrate 1 and the sensor chip 2. Each of the wires 3 is preferably formed by reverse bonding so as to reduce a height thereof.

Figure 4:
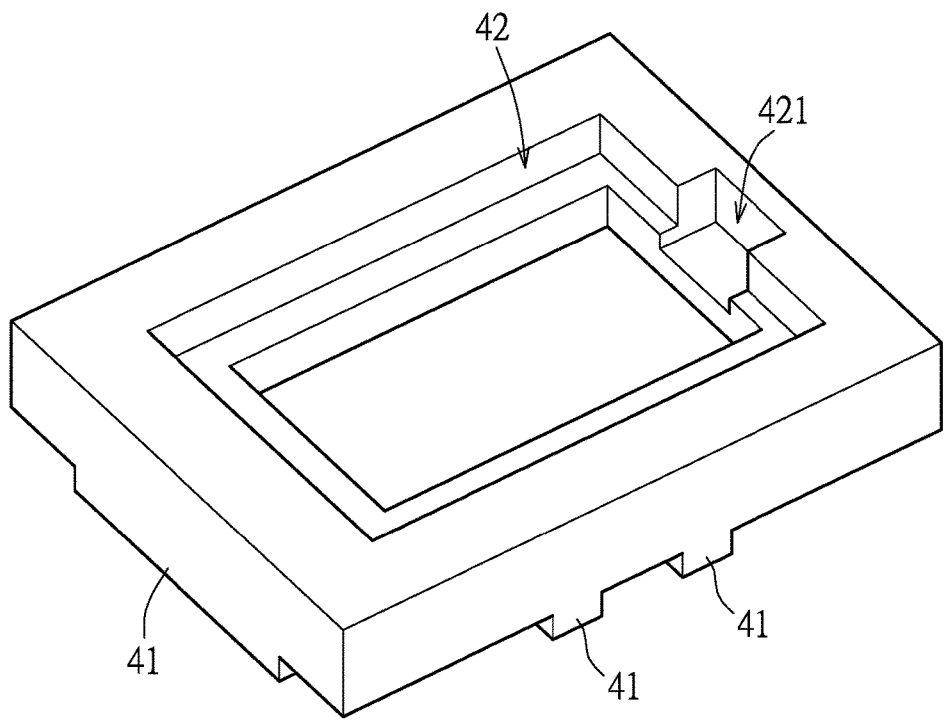
FIG. 4 is a perspective view showing a supporting frame of the sensor package structure according to the first embodiment of the present disclosure.

The supporting frame 4 in the present embodiment is a ring-shaped structure, and includes a plurality of supporting protrusions 41 arranged at an outer periphery thereof (as shown in FIG. 1 or FIG. 4) and a positioning portion 42 arranged at an inner periphery thereof. The positioning portion 42 in the present embodiment is a ring-shaped groove formed inwards a top part of the inner periphery of the supporting frame 4.

Moreover, the supporting protrusions 41 of the supporting frame 4 are disposed on the substrate 1. The portions of the substrate 1 contacting the supporting protrusions 41 are respectively arranged outside the chip bonding region 11, and respectively correspond in position to the two short edges of the chip bonding region 11 and the long edge, which is provided without any of the first pads 12 arranged outside thereof, of the chip bonding region 11 A bottom of the inner periphery of the supporting frame 4 is adhered to the sensor chip 2 by the sealant 5, and the sealant 5 is partially arranged between the sensing region 21 and the second pads 22 (in other embodiments, the sealant 5 may cover the second pads 22 as well), thereby connecting the supporting frame 4 to the sensor chip 2 in a substantially seamless manner.

The transparent cover 6 in the present embodiment is a light transmissible flat plate and substantially corresponds in shape to (e.g., identical to or slightly smaller than) the positioning portion 42. A thickness of the transparent cover 6 is preferably larger than a depth of the positioning portion 42 (i.e., the ring-shaped groove). In other words, the size of the transparent cover 6 in the present embodiment is larger than that of the sensor chip 2 (or the chip bonding region 11).

Moreover, the bottom portion of the transparent cover 6 is disposed in the positioning portion 42 of the supporting frame 4, and the top portion of the transparent cover 6 in the present embodiment protrudes from the positioning portion 42. The transparent cover 6 is fixed in position above the sensor chip 2 by the positioning portion 42 so as to maintain a vertical distance D from the transparent cover 6 to the sensor chip 2. That is, in the sensor package structure 100 of the embodiment, the vertical distance D between the transparent cover 6 and the sensor chip 2 can be precisely controlled by adjusting or changing the positioning portion 42. The vertical distance D in the present embodiment is preferably more than or equal to 200 μm. In another preferred embodiment, the vertical distance D is preferably equal to 300 μm.

As shown in FIGS. 3 and 4, the supporting frame 4 has a notch 421 formed in the positioning portion 42 (or the ring-shaped groove), and side walls of the notch 421 and the transparent cover 6 jointly define an air channel C therebetween. The air channel C connects to a space between the sensing region 21 and the transparent cover 6. Accordingly, in the manufacturing process of the sensor package structure 100, the problem of position deviation of the transparent cover 6 caused by expansion of air between the sensing region 21 and the transparent cover 6 can be effectively avoided by the air channel C.

Moreover, a part of the notch 421 corresponds to the supporting protrusion 41 which is at one of the two short edges of the chip bonding region 11, and an exit of the air channel C is arranged above the corresponding supporting protrusion 41.

The retaining wall 7 is disposed on the top surface of the transparent cover 6 and adjacent to edges of the transparent cover 6. The retaining wall 7 covers a part of the top surface of the transparent cover 6. The retaining wall 7 of the present embodiment is ring-shaped and is separated from the edges of the transparent cover 6 by a distance. Specifically, a projection region defined by orthogonally projecting the retaining wall 7 onto the top surface of the sensor chip 2 is preferably arranged around the sensing region 21.

The present embodiment is illustrated in terms of having multiple electronic components, and the type of each electronic component 8 can be adapted according to design requirements and is not limited to that disclosed in the present embodiment. The electronic components 8 are disposed on the substrate 1 and are respectively arranged outside the two long edges of the chip bonding region 11. A part of the electronic components 8 corresponds in position to (or is adjacent to) the long edge of the chip bonding region 11 without any first pad 12 disposed on, and is arranged under the supporting frame 4.

The molding compound 9 is mostly disposed on a portion of the substrate 1 outside the chip bonding region 11. That is to say, a projected region defined by orthogonally projecting the molding compound 9 onto the top surface of the substrate 1 is preferred to be mostly outside of the chip bonding region 11. Side surfaces of the molding compound 9 are substantially and respectively flush with those of the substrate 1, and a top surface of the molding compound 9 is substantially flush with that of the retaining wall 7.

Specifically, the molding compound 9 covers the first pads 12, the second pads 22, the wires 3, and the electronic components 8. The molding compound 9 covers the upper surface of the supporting frame 4 and is connected to outer sides of the retaining wall 7. Moreover, the molding compound 9 covers a top side and outer sides of a part of the transparent cover 6 between the upper surface of the supporting frame 4 and the retaining wall 7. A distance from the top surface of the molding compound 9 to the substrate 1 is larger than a distance from the top surface of the transparent cover 6 to the substrate 1.

Figure 5:
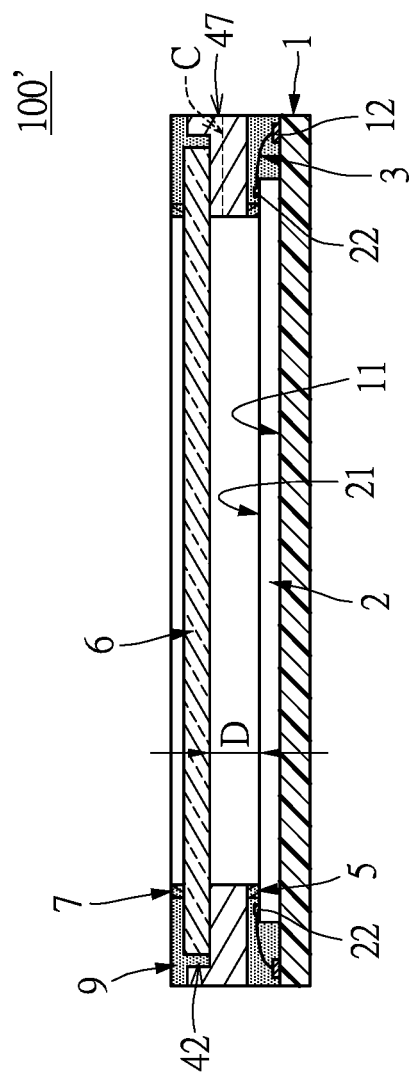
FIG. 5 is a cross-sectional view showing the sensor package structure after cutting according to the first embodiment of the present disclosure.

The above description discloses the sensor package structure 100 which has not been cut in the embodiment. The uncut sensor package structure 100 can be cut along two cutting lines S as shown in FIG. 3 or FIG. 1 so as to form the sensor package structure 100' as shown in FIG. 5, thereby reducing the package size. The following description discloses the differences of the sensor package structure 100' which underwent a cutting process in the embodiment.

As shown in FIG. 5, at least one of outer side surfaces of the supporting frame 4 is a cut surface 47 that is flush with an adjacent side surface of the molding compound 9. Specifically, two of the supporting protrusions 41 corresponding in position to the two short edges of the chip bonding region 11 have been cut off to form two cut surfaces 47, and the exit of the air channel C is changed to be located on one of the two cut surfaces 47.

Second Embodiment

Reference is made to FIGS. 6 to 9, which illustrate a second embodiment of the present disclosure. Since some components of the sensor package structures 200, 200' in the present embodiment are similar to those disclosed in the first embodiment, the following description shall not recite the common ground between the two embodiments again.

Figure 6:
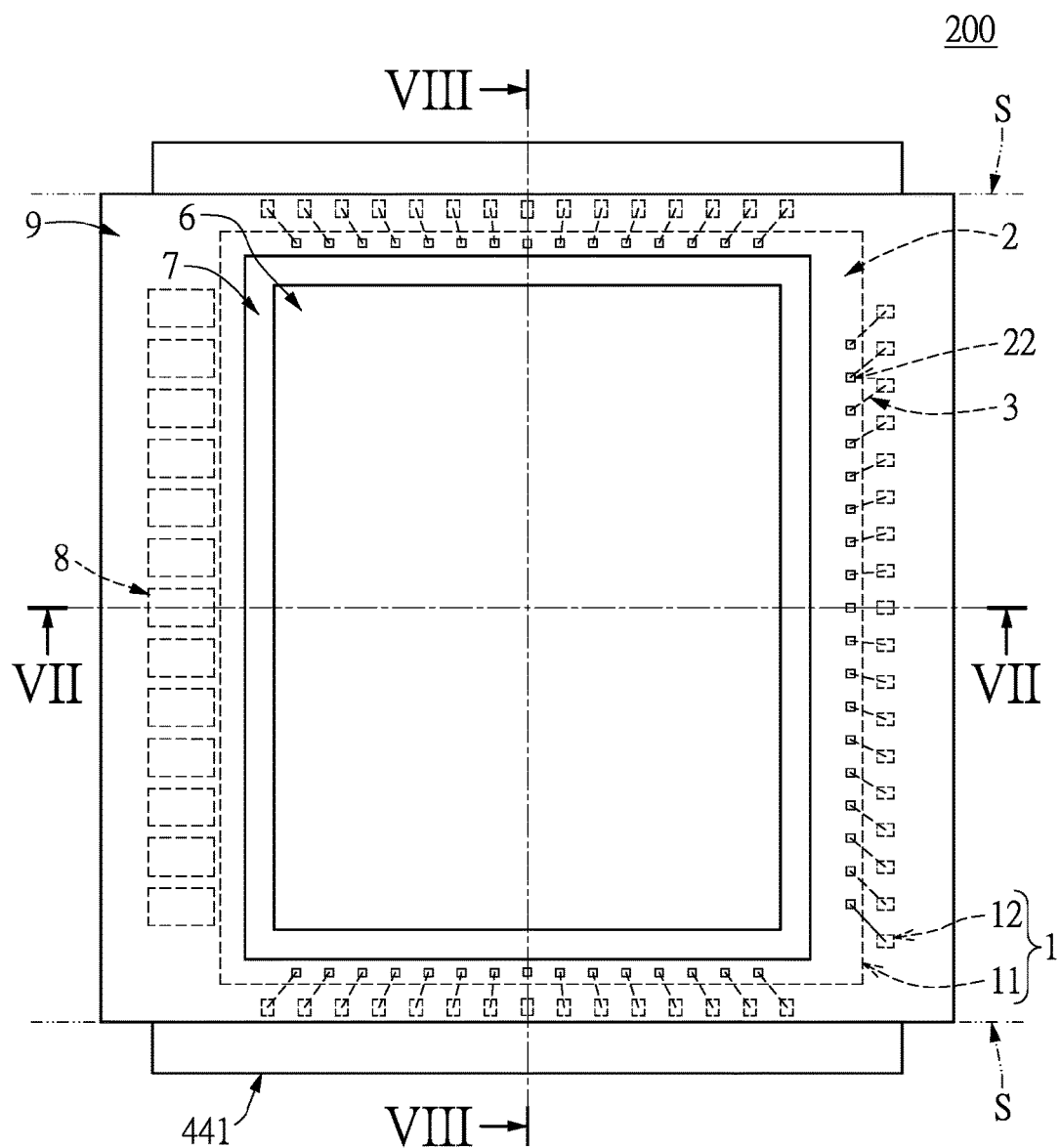
FIG. 6 is a top planar view showing a sensor package structure before cutting according to a second embodiment of the present disclosure.
Figure 7:
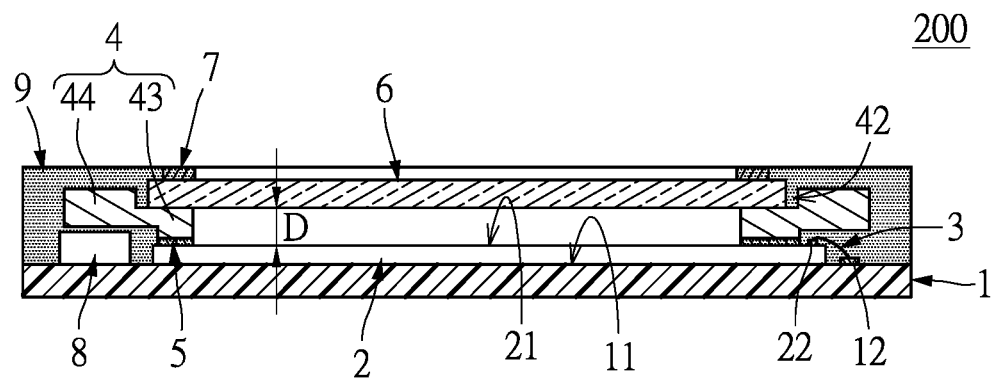
FIG. 7 is a cross-sectional view taken along a cross-sectional line VII-VII of FIG. 6.
Figure 8:
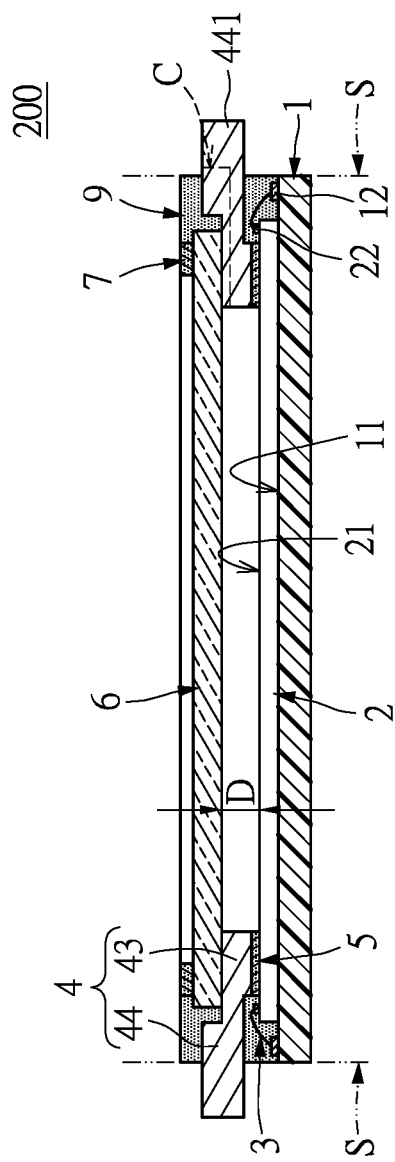
FIG. 8 is a cross-sectional view taken along a cross-sectional line VIII-VIII of FIG. 6.

As shown in FIGS. 6 to 8, the sensor package structure 200 includes a substrate 1, a sensor chip 2 disposed on the substrate 1, a plurality of wires 3 electrically connected to the substrate 1 and the sensor chip 2, a supporting frame 4 disposed on the sensor chip 2 and not in contact with the substrate 1, a sealant 5 adhering the supporting frame 4 to the sensor chip 2, a transparent cover 6 disposed on the supporting frame 4, a retaining wall 7 disposed on a top surface of the transparent cover 6, a molding compound 9 filling in-between the substrate 1 and the supporting frame 4 and covering a part of an upper surface of the supporting frame 4, and at least one electronic component 8 disposed on the substrate 1 and embedded in the molding compound 9.

The following description discloses the structure and interconnection of each component of the sensor package structure 200.

The supporting frame 4 in the present embodiment is a ring-shaped structure and is provided without any supporting protrusion 41. The supporting frame 4 includes a positioning portion 42 arranged at an inner periphery thereof, and the structure of the positioning portion 42 is substantially identical to that of the first embodiment and will not be described again herein. The supporting frame 4 includes an inner ring-shaped portion 43 and an outer ring-shaped portion 44 connected to and arranged outside the inner ring-shaped portion 43, and the positioning portion 42 is formed above the inner ring-shaped portion 43.

The inner ring-shaped portion 43 of the supporting frame 4 is disposed on the sensor chip 2 (i.e., arranged above edges of the sensor chip 2), and the portion of the sensor chip 2 contacting the inner ring-shaped portion 43 is arranged outside the chip bonding region 11. In more detail, the supporting frame 4 does not contact the substrate 1 and is spaced apart from the substrate 1 by a distance. A bottom of the inner ring-shaped portion 43 of the supporting frame 4 is adhered to the sensor chip 2 by the sealant 5, and the sealant 5 is partially arranged between the sensing region 21 and the second pads 22 (in other embodiments, the sealant 5 can cover the second pads 22), thereby connecting the supporting frame 4 to the sensor chip 2 in a substantially seamless manner. Moreover, two parts of the outer ring-shaped portion 44 in the present embodiment, which respectively correspond in position to or are respectively arranged adjacent to the two short edges of the sensing region 21, protrude from the substrate 1, and each of the two parts of the outer ring-shaped portion 44 is defined as an exposed segment 441.

In addition, the supporting frame 4 and the transparent cover 6 jointly define an air channel C there-between, which is similar to that of the first embodiment. In the present embodiment, a part of the notch 421 corresponds to one of the two exposed segments 441 of the outer ring-shaped portion 44, and an exit of the air channel C is located at an upper surface of the corresponding exposed segment 441.

The present embodiment is illustrated in terms of having multiple electronic components, and the type of each electronic component 8 can be adapted according to design requirements and is not limited to the present embodiment. The electronic components 8 are disposed on the substrate 1 and correspond in position to (or are arranged adjacent to) the long edge of the chip bonding region 11 where there is no first pad 12 disposed, and are arranged under the outer ring-shaped portion 44 of the supporting frame 4.

The molding compound 9 covers the first pads 12, the second pads 22, the wires 3, and the electronic components 8. The molding compound 9 covers a part of the upper surface of the supporting frame 4 and is connected to outer sides of the retaining wall 7. Moreover, the molding compound 9 covers a top side and outer sides of a part of the transparent cover 6 between the upper surface of the supporting frame 4 and the retaining wall 7. The two exposed segments 441 of the supporting frame 4 protrude from the molding compound 9.

Figure 9:
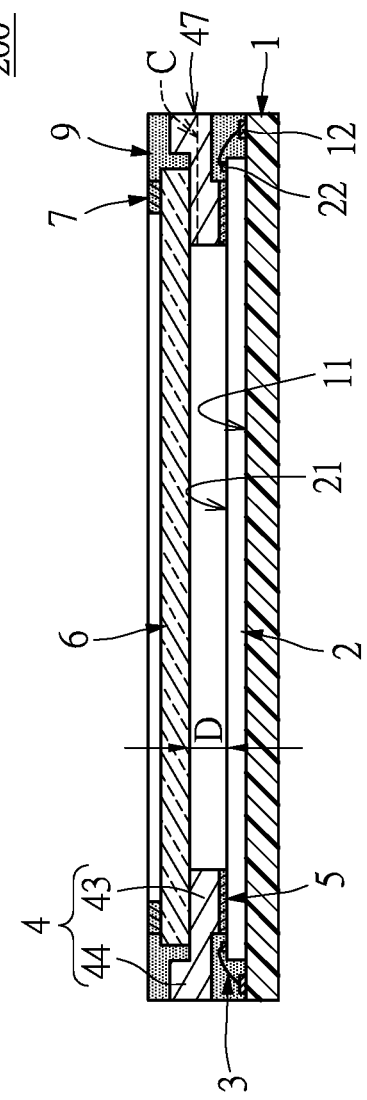
FIG. 9 is a cross-sectional view showing the sensor package structure after cutting according to the second embodiment of the present disclosure.

The above description discloses the sensor package structure 200 which has not been cut in the embodiment. The uncut sensor package structure 200 can be cut along two cutting lines S as shown in FIG. 8 or FIG. 6 to form the sensor package structure 200' as shown in FIG. 9, thereby reducing the package size. The following description discloses the differences of the sensor package structure 200' which underwent a cutting process in the embodiment.

As shown in FIG. 9, at least one of outer side surfaces of the supporting frame 4 of the sensor package structure 200' is a cut surface 47 flush with an adjacent side surface of the molding compound 9. Specifically, the two exposed segments 441 of the supporting frame 4 are cut off to form two cut surfaces 47, and the exit of the air channel C is changed to be located on one of the two cut surfaces 47.

Third Embodiment

Reference is made to FIGS. 10 to 13, which illustrate a third embodiment of the present disclosure. Some components of the sensor package structures 300, 300' in the present embodiment are similar to those disclosed in the first embodiment, so the following description shall not repeat description about the common ground of the two embodiments again.

Figure 10:
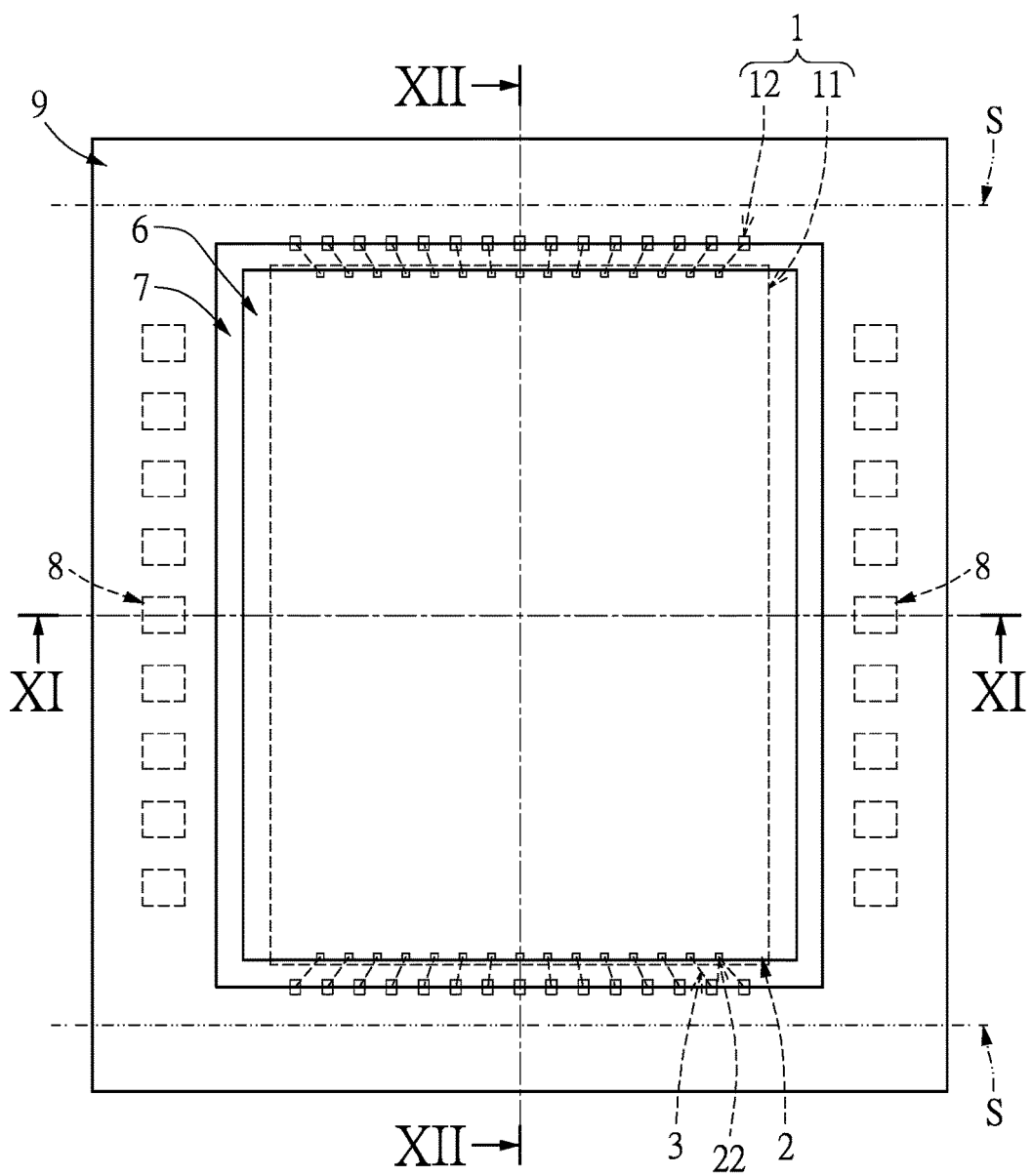
FIG. 10 is a top planar view showing a sensor package structure before cutting according to a third embodiment of the present disclosure.
Figure 11:
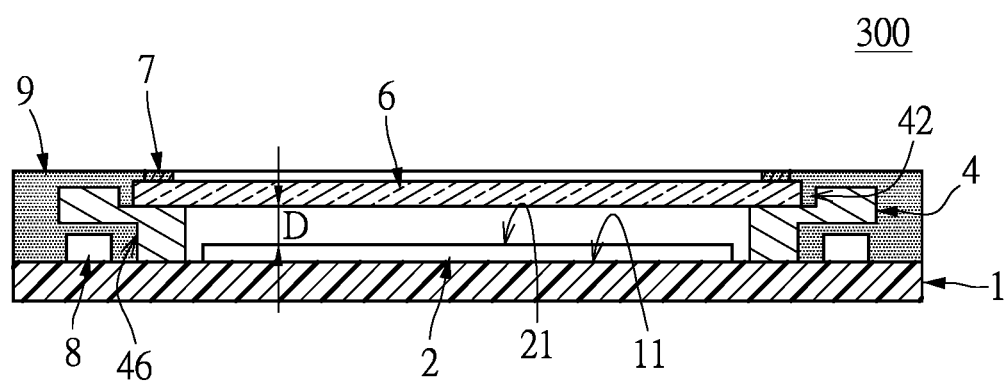
FIG. 11 is a cross-sectional view taken along a cross-sectional line XI-XI of FIG. 10.
Figure 12:
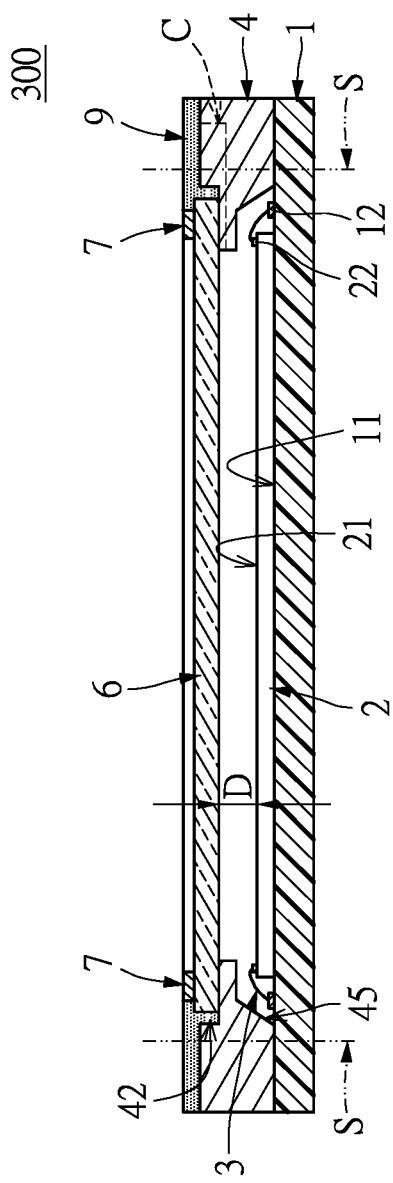
FIG. 12 is a cross-sectional view taken along a cross-sectional line XII-XII of FIG. 10.

As shown in FIGS. 10 to 12, the sensor package structure 300 includes a substrate 1, a sensor chip 2 disposed on the substrate 1, a plurality of wires 3 electrically connected to the substrate 1 and the sensor chip 2, a supporting frame 4 disposed on the substrate 1, a transparent cover 6 disposed on the supporting frame 4, a retaining wall 7 disposed on a top surface of the transparent cover 6, a molding compound 9 filling in-between the substrate 1 and the supporting frame 4 and covering a part of an upper surface of the supporting frame 4, and a plurality of electronic components 8 disposed on the substrate 1 and embedded in the molding compound 9. The following description discloses the structure and interconnection of each component of the sensor package structure 300.

The first pads 12 of the substrate 1 are respectively arranged outside the two short edges of the chip bonding region 11. The second pads 22 of the sensor chip 2 are respectively arranged outside the two short edges of the sensing region 21 and respectively correspond in position to the first pads 12. In other words, none of the first pads 12 are arranged outside each of the two long edges of the chip bonding region 11 of the substrate 1, and none of the second pads 22 are arranged outside each of the two long edges of the sensing region 21 of the sensor chip 2.

The supporting frame 4 in the present embodiment is a ring-shaped structure, and the supporting frame 4 includes two elongated supporting protrusions 41 arranged at an outer periphery thereof and a positioning portion 42 arranged at an inner periphery thereof. Since the structure of the positioning portion 42 is substantially identical to that of the first embodiment, details thereof will not be repeated herein. In the present embodiment, the supporting frame 4 respectively has an inner groove 45 at each of two opposite inner sides, and respectively has an outer groove 46 at each of two opposite outer sides.

Furthermore, the supporting protrusions 41 of the supporting frame 4 are disposed on the substrate 1. The portions of the substrate 1 contacting the supporting protrusions 41 are respectively arranged outside the chip bonding region 11, and respectively correspond in position to the two short edges of the chip bonding region 11. The inner grooves 45 of the supporting frame 4 respectively correspond in position to the two short edges of the chip bonding region 11, and the outer grooves 46 of the supporting frame 4 respectively correspond in position to the two long edges of the chip bonding region 11. The wires 3 are respectively disposed in the two inner grooves 45, and the electronic components 8 are respectively disposed in the two outer grooves 46.

In addition, the supporting frame 4 and the transparent cover 6 jointly define an air channel C there-between in a manner similar to that of the first embodiment. In the present embodiment, a part of the notch 421 corresponds to one of the two supporting protrusions 41 of the supporting frame 4, and an exit of the air channel C is located above the corresponding supporting protrusion 41.

The molding compound 9 is distributed outside and above the supporting frame 4. In other words, the molding compound 9 fills into the outer grooves 46 of the supporting frame 4, but does not fill into the inner grooves 45. Therefore, the molding compound 9 covers the electronic components 8, but does not cover the first pads 12, the second pads 22, and the wires 3. Side surfaces of the molding compound 9 are substantially and respectively flush with those of the substrate 1, and a top surface of the molding compound 9 is substantially flush with that of the retaining wall 7.

Figure 13:
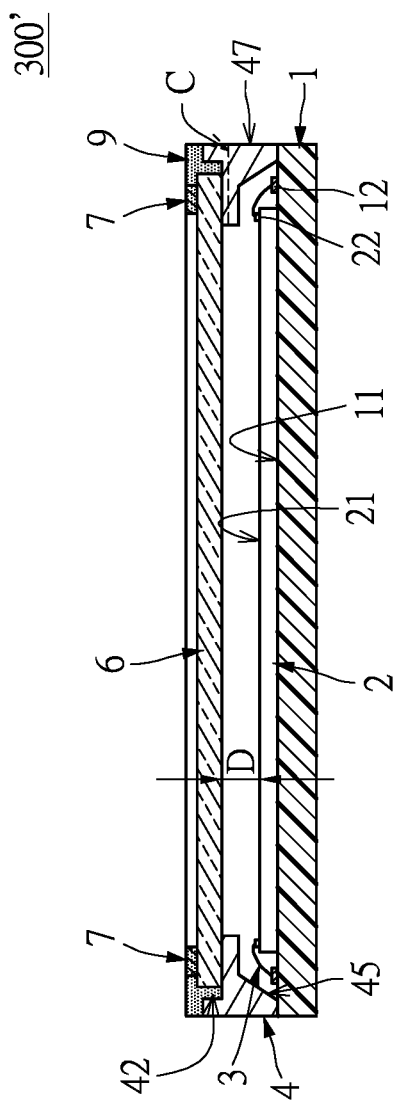
FIG. 13 is a cross-sectional view showing the sensor package structure after cutting according to the third embodiment of the present disclosure.

The sensor package structure 300 which has not been cut in the embodiment has been disclosed in the above description. The uncut sensor package structure 300 can be cut along two cutting lines S as shown in FIG. 12 or FIG. 10 to form the sensor package structure 300' as shown in FIG. 13, thereby reducing the package size. The following description discloses the differences of the sensor package structure 300' which underwent a cutting process in the embodiment.

As shown in FIG. 13, at least one of outer side surfaces of the supporting frame 4 is a cut surface 47 flush with an adjacent side surface of the molding compound 9. Specifically, the two supporting protrusions 41 of the supporting frame 4 are partially cut off to form two cut surfaces 47, and the exit of the air channel C is changed to be located on one of the two cut surfaces 47.

Fourth Embodiment

Figure 14A:
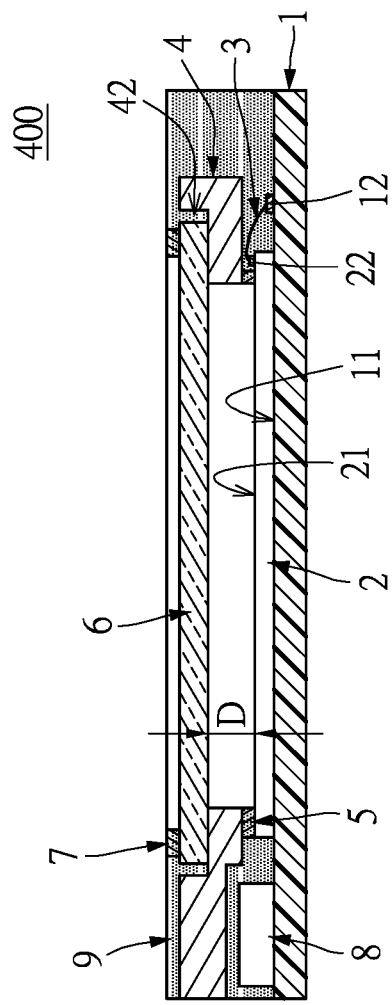
FIG. 14A is a cross-sectional view showing a sensor package structure according to a fourth embodiment of the present disclosure.
Figure 14B:
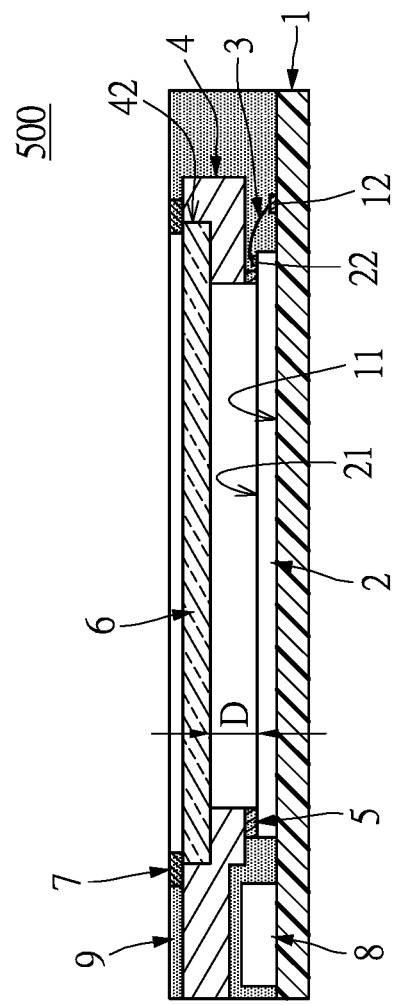
FIG. 14B is a cross-sectional view showing a sensor package structure in another configuration according to the fourth embodiment of the present disclosure.

Reference is made to FIGS. 14A and 14B, which illustrate a fourth embodiment of the present disclosure. Some components of the sensor package structure 400, 500 in the present embodiment are similar to those disclosed in the first embodiment, so identical features will not be recited again.

In the sensor package structure 400, 500 of the present embodiment, a top surface of the transparent cover 6 is flush with that of the supporting frame 4. Moreover, in the sensor package structure 500 as shown in FIG. 14B, the retaining wall 7 covers on (or is disposed on) the outer periphery of the top surface of the transparent cover 6 and the inner periphery of the top surface of the supporting frame 4.

The Effects Associated With the Present Embodiments

In summary, the vertical distance between the transparent cover and the sensor chip in the sensor package structure of the present disclosure can be effectively maintained by substantially embedding the supporting frame in the molding compound (i.e., the molding compound fills in-between the substrate and the supporting frame and covers a part of the upper surface of the supporting frame). Moreover, the positioning portion is formed in the supporting frame, which is capable of fixing the transparent cover, thereby maintaining the relative position of the transparent cover and the sensor chip.

In addition, the vertical distance of the sensor package structure in the present disclosure can be precisely controlled by adjusting or changing the positioning portion. For example, the vertical distance of the sensor package structure can be controlled to 200 µm or 300 µm. Moreover, the supporting frame of the sensor package structure substantially embedded in the molding compound can be cut off to thereby reduce the package size of the sensor package structure.

Furthermore, the sensor package structures as disclosed in the first, second, and fourth embodiments may reach the "molding on chip (MOC)" technology threshold by embedding the supporting frames into the molding compounds, thereby effectively reducing the size of the sensor package structure.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A sensor package structure, comprising:
a substrate including a chip bonding region and a plurality of first pads arranged outside the chip bonding region;
a sensor chip disposed on the chip bonding region and including a sensing region and a plurality of second pads arranged outside the sensing region;
a plurality of wires each having a first end and an opposite second end, wherein the first ends of the wires are respectively connected to the first pads, and the second ends of the wires are respectively connected to the second pads;
a supporting frame arranged above the substrate and/or the sensor chip, wherein the supporting frame includes a positioning portion formed at an inner periphery thereof;
a transparent cover disposed on the supporting frame, wherein the transparent cover is fixed in position above the sensor chip by the positioning portion so as to maintain a vertical distance from the transparent cover to the sensor chip;
a molding compound filling the space in-between the substrate and the supporting frame and covering a part of an upper surface of the supporting frame, wherein at least one of outer side surfaces of the supporting frame is a cut surface channel is formed between the supporting frame and the transparent cover, the air channel is in spatial communication with a space between the sensing region and the transparent cover, and the air channel has an exit arranged on the cut surface of the supporting frame that is flush with the adjacent side surface of the molding compound; and
a retaining wall disposed on and connected to an outer periphery of the top surface of the transparent cover and an inner periphery of the top surface of the supporting frame, wherein the molding compound is connected to outer sides of the retaining wall.

2. The sensor package structure as claimed in claim 1, wherein the vertical distance is more than or equal to 200 µm.

3. The sensor package structure as claimed in claim 1, wherein the substrate has a square shape or a rectangular shape, and at least one edge of the substrate has a length less than or equal to 7.5 mm.

4. The sensor package structure as claimed in claim 1, wherein the supporting frame does not contact the substrate and is spaced apart from the substrate by a distance.

5. The sensor package structure as claimed in claim 1, wherein a distance from a top surface of the molding compound to the substrate is larger than a distance from the top surface of the transparent cover to the substrate.

6. The sensor package structure as claimed in claim 1, wherein the supporting frame contacts the substrate.

7. The sensor package structure as claimed in claim 1, wherein the positioning portion is a ring-shaped groove having a notch, side walls of the notch and the transparent cover jointly define the air channel there-between.

8. The sensor package structure as claimed in claim 1, further comprising a sealant, wherein the supporting frame is adhered to the sensor chip by the sealant, and a part of the sealant is arranged between the sensing region and the second pads or covers the second pads.

9. The sensor package structure as claimed in claim 1, wherein the first pads, the second pads, and the wires are embedded in the molding compound.

10. The sensor package structure as claimed in claim 1, further comprising at least one electronic component disposed on the substrate and embedded in the molding compound, wherein the supporting frame includes an inner ring-shaped portion and an outer ring-shaped portion, the inner ring-shaped portion is arranged above edges of the sensor chip, the outer ring-shaped portion is connected to and arranged outside the inner ring-shaped portion, and the at least one electronic component is arranged under the outer ring-shaped portion.

11. The sensor package structure as claimed in claim 1, wherein the supporting frame respectively has an inner groove at each of two opposite inner sides thereof, the wires are respectively disposed in the inner grooves, the supporting frame respectively has an outer groove at each of two opposite outer sides thereof, the sensor package structure further comprises a plurality of electronic components disposed on the substrate and embedded in the molding compound, and the electronic components are respectively disposed in the outer grooves.

* * * * *